US010389943B2

(12) United States Patent
Gutierrez

(10) Patent No.: US 10,389,943 B2
(45) Date of Patent: Aug. 20, 2019

(54) ACTUATOR FOR MOVING AN OPTOELECTRONIC DEVICE

(71) Applicant: MEMS Start, LLC, Arcadia, CA (US)

(72) Inventor: Roman C. Gutierrez, Arcadia, CA (US)

(73) Assignee: MEMS Start, LLC, Arcadia, CA (US)

( * ) Notice: Subject to any disclaimer, the term of this patent is extended or adjusted under 35 U.S.C. 154(b) by 269 days.

(21) Appl. No.: 15/224,399

(22) Filed: Jul. 29, 2016

(65) Prior Publication Data

US 2016/0337592 A1   Nov. 17, 2016

Related U.S. Application Data

(63) Continuation of application No. 14/630,437, filed on Feb. 24, 2015, now Pat. No. 9,807,305.

(Continued)

(51) Int. Cl.
*H04N 5/238* (2006.01)
*H02N 1/08* (2006.01)
(Continued)

(52) U.S. Cl.
CPC .......... *H04N 5/23287* (2013.01); *G03B 3/10* (2013.01); *H02N 1/008* (2013.01); *H04N 5/2252* (2013.01);
(Continued)

(58) Field of Classification Search
CPC ...... G02B 7/003; G02B 7/005; G02B 27/646; G02B 7/00; H04N 5/2253; H04N 5/2254;
(Continued)

(56) References Cited

U.S. PATENT DOCUMENTS 4,554,586 A * 11/1985 Tanuma ............ H01L 27/14831
257/E27.154
5,214,513 A * 5/1993 Lee ..................... H04N 1/19505
335/279

(Continued)

FOREIGN PATENT DOCUMENTS

CN        101556276 A        10/2009

OTHER PUBLICATIONS

State Intellectual Property Office of PRC, Notification of First Office Action, dated Apr. 13, 2017, pp. 1-2.

(Continued)

*Primary Examiner* — Burton S Mullins
(74) *Attorney, Agent, or Firm* — Sheppard Mullin Richter & Hampton LLP

(57) ABSTRACT

An actuator for moving a platform having electrical connections is provided. The actuator includes an outer frame connected to an inner frame by one or more spring elements that are electrically conductive. The actuator further includes one or more comb drive actuators that apply a controlled force between the outer frame and the inner frame. Each of the comb drive actuators includes one or more comb drives. Moreover, a method for moving a platform having electrical connections is also provided. The method includes connecting an outer frame to an inner frame using one or more spring elements that are electrically conductive. The method further includes generating a controlled force using one or more comb drive actuators. Each of the comb drive actuators includes one or more comb drives. In addition, the method includes applying the controlled force between the outer frame and the inner frame.

5 Claims, 9 Drawing Sheets

Related U.S. Application Data

(60) Provisional application No. 61/975,617, filed on Apr. 4, 2014.

(51) Int. Cl.

| | | |
|---|---|---|
| *H04N 5/232* | (2006.01) | |
| *G03B 3/10* | (2006.01) | |
| *H02N 1/00* | (2006.01) | |
| *H04N 5/225* | (2006.01) | |
| *B81B 3/00* | (2006.01) | |

(52) U.S. Cl.
CPC ......... *H04N 5/2253* (2013.01); *H04N 5/2254* (2013.01); *B81B 3/0062* (2013.01); *B81B 2201/033* (2013.01); *B81B 2203/0136* (2013.01); *G03B 2205/0053* (2013.01); *G03B 2205/0084* (2013.01)

(58) Field of Classification Search
CPC ............. H04N 5/2257; H04N 5/23264; H04N 5/2328; H04N 5/23287
USPC ............. 310/308–309; 348/208.4, 208, 7, 11
See application file for complete search history.

(56) References Cited

U.S. PATENT DOCUMENTS

| | | | | |
|---|---|---|---|---|
| 5,536,988 | A * | 7/1996 | Zhang ................... | B81B 3/0021 310/309 |
| 5,780,948 | A | 7/1998 | Lee et al. | |
| 5,959,516 | A | 9/1999 | Chang et al. | |
| 6,116,756 | A | 9/2000 | Peeters et al. | |
| 6,188,322 | B1 | 2/2001 | Yao et al. | |
| 6,591,678 | B2 | 7/2003 | Sakai | |
| 6,781,279 | B2 | 8/2004 | Lee et al. | |
| 6,905,614 | B1 * | 6/2005 | Novotny ................... | G02B 6/32 216/2 |
| 6,989,921 | B2 * | 1/2006 | Bernstein .............. | B81B 3/0062 359/224.1 |
| 7,056,765 | B2 * | 6/2006 | Loo ..................... | B81C 1/00269 257/787 |
| 7,161,274 | B2 | 1/2007 | Tsuboi et al. | |
| 7,190,404 | B2 * | 3/2007 | Shinomiya ........ | H01L 27/14618 348/340 |
| 7,205,867 | B2 | 4/2007 | Lutz et al. | |
| 7,214,919 | B2 * | 5/2007 | Boemler ........... | H01L 27/14618 250/208.1 |
| 7,262,541 | B2 | 8/2007 | Xiaoyu et al. | |
| 7,489,340 | B2 * | 2/2009 | Koo ..................... | G02B 13/001 348/208.7 |
| 7,508,111 | B2 | 3/2009 | Ko et al. | |
| 7,538,927 | B1 | 5/2009 | Fu | |
| 7,589,912 | B2 * | 9/2009 | Chen ..................... | G02B 7/102 359/694 |
| 7,777,596 | B2 * | 8/2010 | Lutz ........................ | B81B 3/007 310/309 |
| 7,871,687 | B2 | 1/2011 | Kouma et al. | |
| 7,923,894 | B2 | 4/2011 | Obi et al. | |
| 8,035,693 | B2 * | 10/2011 | Chiou .................. | H04N 5/2259 348/208.7 |
| 8,138,564 | B2 * | 3/2012 | Kosaka ................ | H04N 5/2257 257/414 |
| 8,248,497 | B2 * | 8/2012 | Tanimura ............ | H04N 5/2253 348/208.4 |
| 8,605,160 | B2 * | 12/2013 | Kwon .................. | H04N 5/2328 348/208.7 |
| 9,088,705 | B1 * | 7/2015 | Tam ..................... | H04N 5/2253 |
| 2003/0227700 | A1 | 12/2003 | Mizuno et al. | |
| 2006/0268383 | A1 * | 11/2006 | Cho .................... | G02B 26/0841 359/225.1 |
| 2009/0134481 | A1 * | 5/2009 | Sengupta ............ | B81C 1/00333 257/415 |
| 2012/0169910 | A1 * | 7/2012 | Singh ..................... | G02B 26/00 348/302 |
| 2012/0262026 | A1 * | 10/2012 | Lin ....................... | B81B 3/0072 310/300 |

OTHER PUBLICATIONS

Patent Cooperation Treaty, International Search Report for PCT/2015/017383, dated Jul. 20, 2015, pp. 1-4.

* cited by examiner

ACTUATOR FOR MOVING AN OPTOELECTRONIC DEVICE

CROSS-REFERENCE TO RELATED APPLICATIONS

This application is a continuation of U.S. patent application Ser. No. 14/630,437, filed Feb. 24, 2015, which claims priority to U.S. Provisional Patent Application Ser. No. 61/975,617, filed Apr. 4, 2014, the contents of which are incorporated herein by reference in their entireties.

TECHNICAL FIELD

This disclosure relates to actuators in general, and in particular, to micro-electro-mechanical-system (MEMS) actuators configured to move a platform having electrical connections.

BACKGROUND

Actuators may be used to convert electronic signals into mechanical motion. In many applications, such as, for example, portable electronic devices, miniature cameras, optical telecommunications components, and medical instruments, it may be beneficial for miniature actuators to fit within the specific size, power, reliability, and cost constraints of the application.

MEMS is a miniaturization technology that uses processes such as photolithography and etching of silicon wafers to form highly precise mechanical structures with electronic functionality. MEMS actuators generally function in a similar fashion to conventional actuators but offer some beneficial features over conventional actuators, and are formed using MEMS processes.

In some applications, such as moving an image sensor in a camera for automatic focusing (AF) or optical image stabilization (OIS), an actuator is used to move an optoelectronic device that has a number of electrical inputs and outputs. For example, European patent No. EP 0253375, entitled "Two-dimensional piezoelectric actuator," by Fukada et al., teaches a design for a two-dimensional actuator that can be used to move an image sensor in a plane. The actuator taught by Fukada, however, is large and unamenable to space-constrained applications. For example, Fukuda's actuator may be used in large, stand-alone digital cameras, but not in miniature cell phone cameras, due to the associated space constraints.

Unlike conventional piezoelectric actuators, MEMS actuators may be used to, for example, move or position certain passive components within miniature cell phone cameras. By way of example, U.S. Pat. No. 8,604,663, entitled "Motion controlled actuator," by Roman Gutierrez et al., and U.S. Patent Application No. 2013/0077945 A1, entitled "Mems-based optical image stabilization," by Xiaolei Liu et al., teach MEMS actuators for moving a lens in a miniature camera (e.g., for use in a cell phone). However, neither of these MEMS actuators is able to move an optoelectronic device that has a number of electrical inputs and outputs. In addition, both of these MEMS actuators utilize deployment mechanisms that add complexity, size, and cost.

BRIEF SUMMARY OF THE DISCLOSURE

The present disclosure is directed to an actuator for moving or positioning a platform having electrical connections. One embodiment of the actuator includes one or more comb drive actuators that apply a controlled force between an inner frame and an outer frame. The platform may include an optoelectronic device or an image sensor. The comb drive actuators of some embodiments of the present disclosure make use of MEMS comb drives and processes to achieve a high level of miniaturization, precision, and power efficiency. Accordingly, the actuator of the present disclosure is highly suitable to, for example, provide optical image stabilization and auto-focus capabilities for cameras in space-constrained environments such as smartphones and the like.

According to one embodiment of the disclosure, an actuator for moving a platform having electrical connections includes an outer frame connected to an inner frame by one or more spring elements. The actuator may be fabricated using a MEMS process. The spring elements in this embodiment are electrically conductive. In one example implementation, the spring elements route electrical signals between the outer frame and the inner frame. In another example, each of the spring elements includes a first end and a second end. The first end connects to a first electrical contact pad disposed on the outer frame, and the second end connects to a second electrical contact pad disposed on the inner frame. The spring elements may include silicon and/or metal and may be soft in all movement degrees of freedom.

The actuator also includes one or more comb drive actuators that apply a controlled force between the outer frame and the inner frame. In one embodiment, a first comb drive actuator applies the controlled force in a first direction, and a second comb drive actuator applies the controlled force in a second direction. The first direction, in one example implementation of the actuator, is substantially orthogonal to the second direction. Each of the comb drive actuators may include one or more comb drives (e.g., electrostatic comb drives). In one example, each of the comb drive actuators includes a first comb drive of a first length and a second comb drive of a second length. The first length is different than the second length. Each of the comb drive actuators, in another embodiment, includes a motion control and is connected to the inner frame by a flexure.

In one example implementation of the actuator, the comb drive actuators are attached to a central anchor that is mechanically fixed with respect to the outer frame. The platform, in one instance, mechanically fixes the central anchor with respect to the outer frame. In one embodiment, the platform is made from silicon and is an optoelectronic device or an image sensor.

According to another embodiment of the disclosure, a packaged actuator includes a circuit board, a MEMS actuator, an optoelectronic device mounted on the MEMS actuator, and a cover. The cover encapsulates the MEMS actuator and the optoelectronic device. The cover is attached to the circuit board and includes a window. In one embodiment, the optoelectronic device is an image sensor coupled to the MEMS actuator. The MEMS actuator, in one example implementation of the packaged actuator, is substantially planar in a plane. In this example, the MEMS actuator is configured to move in two linear degrees of freedom in the plane. In various embodiments, any number of degrees of freedom may be achieved using various MEMS actuator configurations. In another example, the MEMS actuator is further configured to move in one rotational degree of freedom in the plane. Further embodiments may utilize different configurations of the MEMS actuator to achieve additional rotational degrees of freedom.

In an additional embodiment of the packaged actuator, the MEMS actuator includes one or more comb drive actuators that apply a controlled force to a central anchor that is mechanically fixed with respect to the outer frame. Each of the comb drive actuators includes one or more comb drives. Further, the MEMS actuator includes an outer frame connected to an inner frame by one or more spring elements that may be electrically conductive.

The present disclosure also includes a method for moving a platform having electrical connections routed thereto. The method includes connecting an outer frame to an inner frame using one or more spring elements that may be electrically conductive. The method further includes generating a controlled force using one or more comb drive actuators, each of which includes one or more comb drives. Additionally, the method includes applying the controlled force between the outer frame and the inner frame. The controlled force, in one embodiment, includes a first force component and a second force component, and the first and second force components are substantially orthogonal in this embodiment.

In one embodiment, the method further includes mechanically fixing a central anchor with respect to the outer frame. The controlled force, in this embodiment, is applied to the central anchor. In another example implementation, includes routing electrical signals through the spring elements to an optoelectronic device attached to a central anchor. The optoelectronic device in this example mechanically fixes the central anchor with respect to the outer frame.

According to another embodiment of the present disclosure, a method for packaging a miniature actuator includes mechanically and electrically connecting a MEMS actuator onto a plain (or printed) circuit board (PCB); mechanically and electrically connecting an image sensor onto the MEMS actuator; and encapsulating the MEMS actuator and the image sensor using a cover with a window. In one embodiment, solder is used to attach the MEMS actuator to the PCB. In another embodiment, conductive epoxy is used to attach the image sensor to the MEMS actuator. Ink with nano-sized particles of metal is used in another instance to attach the image sensor to the MEMS actuator.

BRIEF DESCRIPTION OF THE DRAWINGS

The present disclosure, in accordance with one or more various embodiments, is described in detail with reference to the following figures.

The figures are provided for purposes of illustration only and merely depict typical or example embodiments of the disclosure. The figures are described in greater detail in the description and examples below to facilitate the reader's understanding of the disclosed technology, and are not intended to be exhaustive or to limit the disclosure to the precise form disclosed. It should be understood that the disclosure may be practiced with modification or alteration, and that such modifications and alterations are covered by one or more of the claims, and that the disclosure may be limited only by the claims and the equivalents thereof. For clarity and ease of illustration, these drawings are not necessarily made to scale.

DETAILED DESCRIPTION

The present disclosure is directed to various embodiments of systems, methods, and apparatuses for moving a platform having electrical connections, and includes packaging of the same. The details of some example embodiments of the systems, methods, and apparatuses of the present disclosure are set forth in the description below. Other features, objects, and advantages of the disclosure will be apparent to one of skill in the art upon examination of the present description, figures, examples, and claims. It is intended that all such additional systems, methods, apparatus, features, and advantages, etc., including modifications thereto, be included within this description, be within the scope of the present disclosure, and be protected by one or more of the accompanying claims.

In accordance with embodiments further described herein, various actuators are provided. These actuators, including the packaging thereof, may be used in a range of different environments, for example, portable electronic devices, miniature cameras, optical telecommunications components, and medical instruments. The features of the disclosed actuators generally allow for a high degree of precision in moving or positioning a platform in multiple degrees of freedom within these various environments, while achieving low power consumption and being highly compact. Accordingly, the disclosed embodiments provide significant benefits, for example, for optical image stabilization and autofocus capabilities, over conventional solutions.

Figure 1:
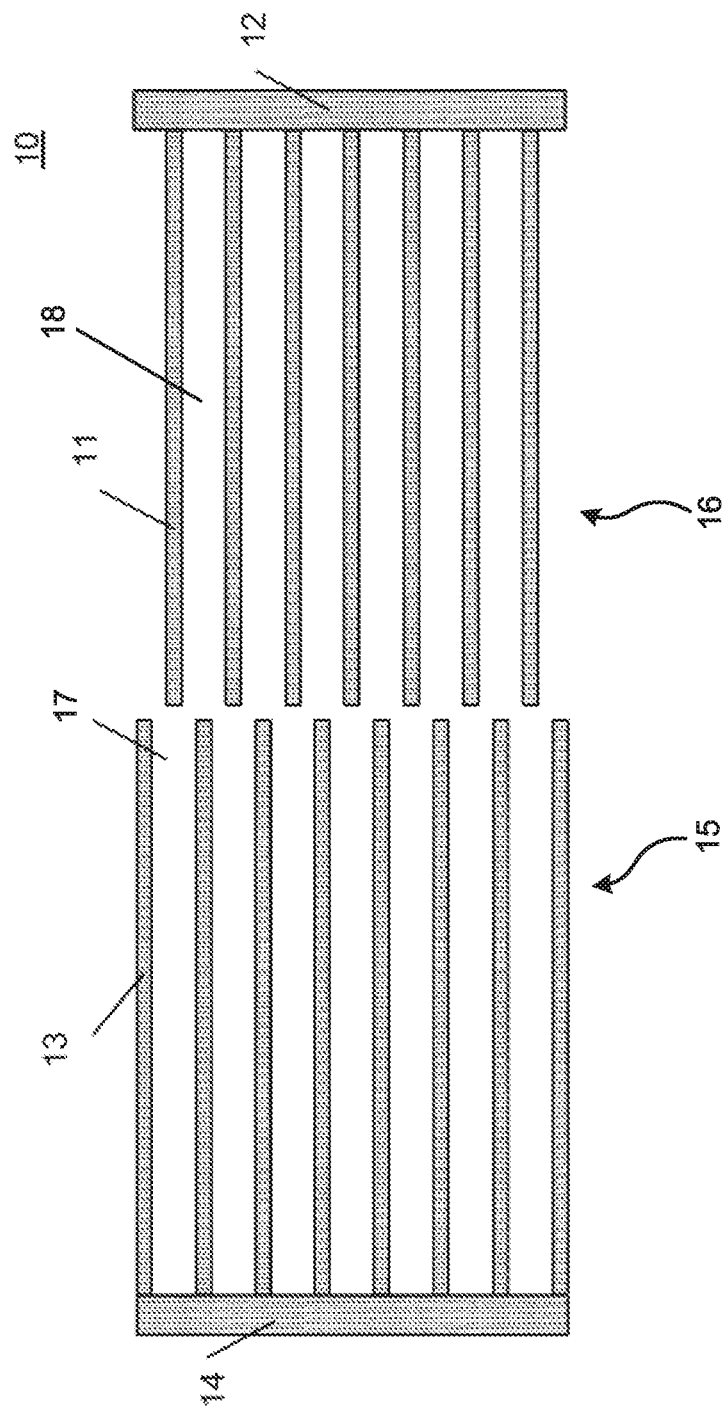
FIG. 1 illustrates a plan view of a comb drive in accordance with example embodiments of the present disclosure.

Referring now to the drawings, FIG. 1 illustrates a plan view of comb drive 10, in accordance with example embodiments of the present disclosure. Comb drive 10 may be an electrostatic comb drive. Comb drive 10 may include comb finger arrays 15 and 16, which may be fabricated on silicon using MEMS processes such as photolithography and etching.

As shown in FIG. 1, comb finger array 16 includes comb fingers 11 and spine 12 that connects comb fingers 11 to one another. Similarly, comb finger array 15 includes comb fingers 13 and spine 14 that connects comb fingers 13 to one another. Comb fingers 11 and 13 may be inter-digitated, such that comb fingers 11 substantially line up with spaces 17 between comb fingers 13, and comb fingers 13 substantially line up with the spaces 18 between comb fingers 13.

When a voltage is applied between comb fingers 11 and comb fingers 13, comb finger array 16 and comb finger array 15 are attracted to or repelled from each other with an electrostatic force proportional to the square of the applied voltage. This electrostatic force may cause comb finger arrays 15 and 16 to move toward or away from one another, depending on the polarity of the electrostatic force (or the voltage). Additionally, the speed with which comb finger arrays 15 and 16 move with respect to one another may depend on the electrostatic force applied. Typically, the design of comb drive 10 is such that comb fingers 11 and 13 may be pulled into or pushed out of an overlapping state by the electrostatic force between comb finger array 15 and comb finger array 16. When comb finger arrays 15 and 16 overlap, comb fingers 11 reside at least partially within space 17 of comb finger array 15, and comb fingers 13 reside at least partially within space 18 of comb finger array 16.

The ratio of comb finger width to depth may be chosen to avoid comb fingers 11 bending into comb fingers 13 when comb fingers 11 and 13 are overlapped. For example, comb fingers 11 and/or 13 may be about 6 micrometers wide by about 150 micrometers long. In general, comb fingers 11 and/or 13 may be between about 1 and 10 micrometers wide and about 20 and 500 micrometers long. The distance between two adjacent comb fingers 11 (or 13) subtracted by the width of one of the corresponding comb finger 13 (or 11) sets the total gap between comb fingers 11 and 13 when brought into overlap by the electrostatic force. In some instances, it may be desirable for this total gap to be relatively small, in order to increase the electrostatic force between comb fingers 11 and comb fingers 13. In addition, it may also be desirable for the total gap to be large enough to deal with variations in the width of comb fingers 11 and/or 13 that arise from process variations. For example, the total gap may be about 5 to 10 micrometers.

The depth of comb fingers 11 and 13 may generally be limited by the particular fabrication process used, and specifically by the etching aspect ratio of that process—this is because it may generally be desirable for the width of comb fingers 11 and 13 on the top to be substantially the same as the width of comb fingers 11 and 13 on the bottom. (The depth aspect of comb fingers 11 and 13 is not illustrated in FIG. 1, but would extend into or out of the page.) For example, comb fingers 11 and 13 may be about 50 to 250 micrometers in depth. Spaces 17 and 18 may either be etched away entirely, or may be removed by other methods known in the art of MEMS micromachining.

Figure 2A:
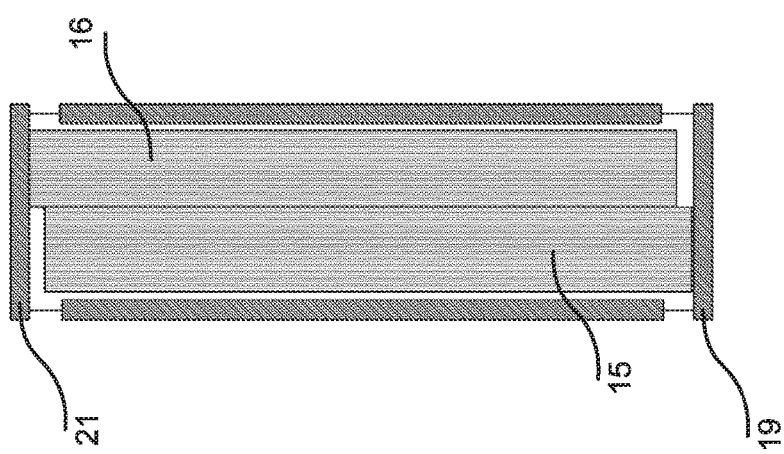
FIG. 2A illustrates a plan view of a comb drive actuator in accordance with example embodiments of the present disclosure.

FIG. 2A illustrates a plan view of a comb drive actuator in accordance with example embodiments of the present disclosure. As shown in FIG. 2A, the illustrated comb drive actuator includes comb finger arrays 15 and 16 (some details of which—e.g., spines 12 and 14—are illustrated in FIG. 1 but are not shown in FIG. 2A), first frame piece 21, and second frame piece 19. Although not shown in detail in FIG. 2A, comb fingers 11 and 13 extend from left to right, and vice versa, in comb finger arrays 15 and 16. Spine 14 of comb finger array 15 may be attached to second frame piece 19, while spine 12 of comb finger array 16 may be attached to first frame piece 21. Configured as such, when comb finger arrays 15 and 16 are attracted to or repelled from one another such that movement occurs, first and second frame pieces 21 and 19 are likewise caused to move (e.g., from left to right or vice versa in FIG. 2A).

Figure 2B:
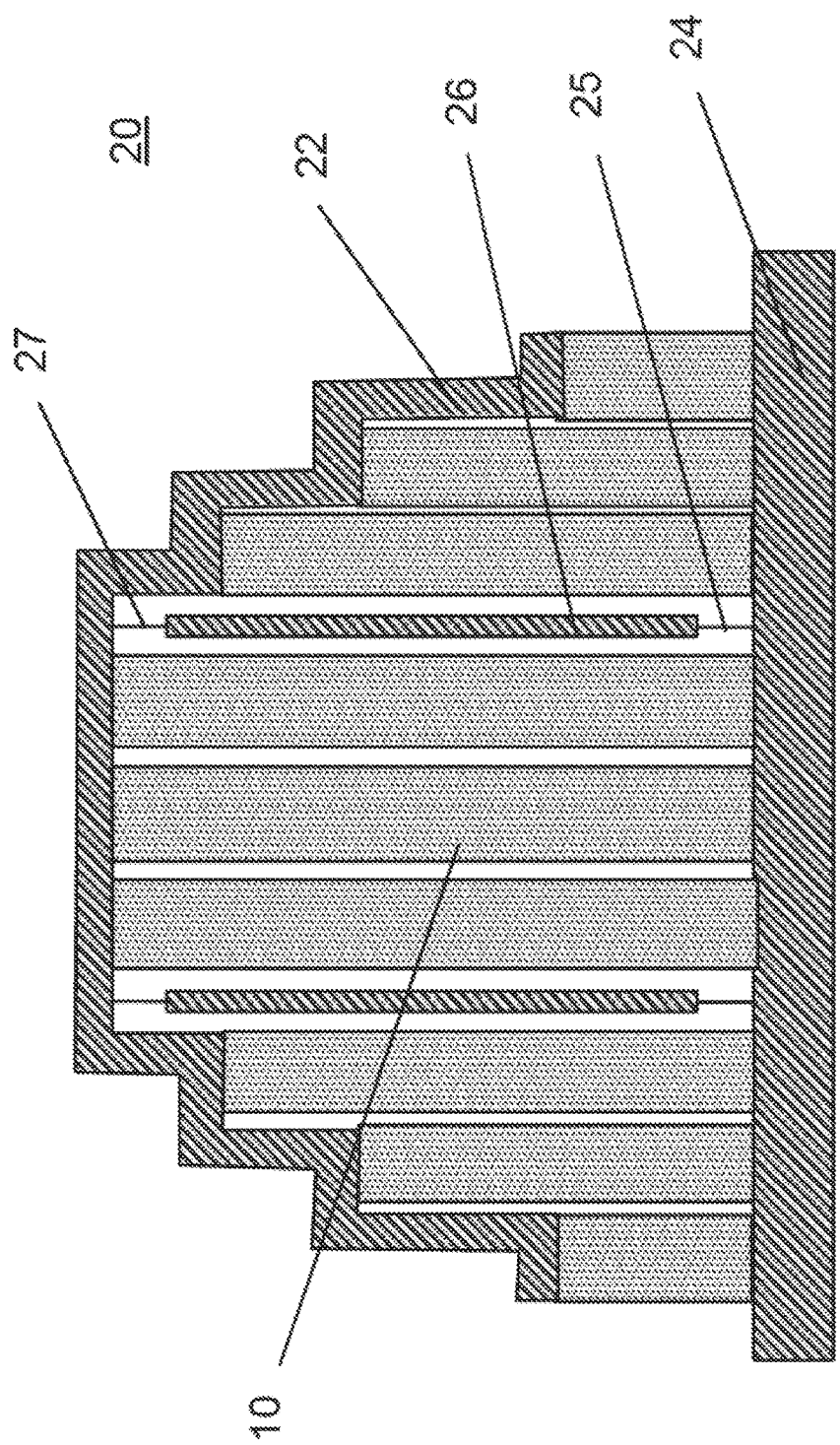
FIG. 2B illustrates a plan view of a comb drive actuator in accordance with example embodiments of the present disclosure.

FIG. 2B illustrates a plan view of comb drive actuator 20 in accordance with example embodiments of the present disclosure. As shown in FIG. 2B, one embodiment of comb drive actuator 20 includes one or more comb drives 10 arranged in a substantially parallel fashion. In the particular embodiment of FIG. 2B, there are nine comb drives 10 shown, but various embodiments of comb drive 20 actuator may include any number, size, and shape of comb drives 10. Comb drive actuator 20 further includes first frame 22, second frame 24, and motion control 26. First frame 22 is illustrated with a stepped shape to account for the varying lengths of the comb drives 10 shown in this particular embodiment of comb drive actuator 20. Nevertheless, in other embodiments—for example, in which all comb drives 10 are uniform in length—the shape of first frame 22 may vary to attach to an end of comb drives 10. In the illustrated embodiment, the stepped shape of first frame 22 and the corresponding diminishing lengths of comb drives 10 allows for a decreased footprint of actuator 30, as will be shown in FIG. 3A. Other variations of comb drive 10 length, shape, arrangement, and configuration may be used to achieve differing degrees, directions, and/or precision of controlled forces, various size footprints, and other characteristics, as will be appreciated by one of skill in the art upon studying the present disclosure.

Although the details of each of comb drives 10 are not shown in FIG. 2B, in the illustrated embodiment of FIG. 2B, spine 12 is connected to first frame 22 and spine 14 is connected to second frame 24. FIG. 2A illustrates one way in which this may be done. In various embodiments, spines 12 and 14 of comb finger arrays 15 and 16 may be attached to first and second frames 22 and 24 in different configurations to achieve different purposes. For example, in one embodiment, for each comb drive 10 of a set of comb drives, spine 12 is attached to first frame 22 while spine 14 is attached to second frame 24. Such a configuration results in a parallel cascade of comb drives 10 that may increase the electrostatic force ultimately applied to first and second frames 22 and 24. In another example embodiment, the comb drives 10 are arranged in a back-to-back fashion to achieve bi-directional movement. In this configuration, for a first comb drive 10, spine 12 is connected to first frame 22 and spine 14 is connected to second frame 24. For a second comb drive 10, however, spine 12 is connected to second frame 24 and spine 14 is connected to first frame 22. Such a configuration results in a back-to-back placement of comb drives 10 that allows for bidirectional movement.

Further regarding comb drive actuator 20, comb drive spines 12 and 14 and first and second frames 22 and 24, in various instances, may be designed wide and deep enough to be rigid and not flex substantially under an applied range of electrostatic forces. For example, spines 12 and 14 may be about 20 to 100 micrometers wide and about 50 to 250 micrometers deep, and first and second frames 22 and 24 may be larger than about 50 micrometers wide and about 50 to 250 micrometers deep.

As mentioned above, one embodiment of comb drive actuator 20 also includes motion control 26 that limits the motion of comb finger arrays 15 and 16 to be substantially parallel to the length of comb fingers 11 and 13 (e.g., left to right in FIG. 2B). In one example implementation of the disclosure, motion control 26 is a double parallel flexure motion control, such as is illustrated in FIG. 2B. A double parallel flexure motion control may produce nearly linear motion, but there may be a slight run-out known as arcuate motion. Nevertheless, the gap on one side of comb fingers 11 may not be equal to the gap on the other side of comb fingers 11, and this may be used advantageously in design to correct for effects such as arcuate motion of a double parallel flexure motion control.

Referring again to the embodiment of comb drive actuator 20 illustrated in FIG. 2B, motion control 26 is a double parallel flexure. Nevertheless, motion control 26 may include other structures that serve to control the motion of first frame 22 and second frame 24. Each motion control 26 in the illustrated embodiment includes thinner portions 25 and 27 on the respective ends of motion control 26. Thinner portions 25 and 27 allow bending when there is a translation of first frame 22 with respect to second frame 24. In terms of dimensions, the thicker portion of motion control 26 may be, for example, about 10 to 50 micrometers wide, and thinner portions 25 and 27 may be about 1 to 10 micrometers wide. In various embodiments, any number and type of motion controls 26 may be used as desired to control or limit the motion of comb finger arrays 15 and 16. Controlled motion may enhance the overall precision with which actuator 30 moves or positions platform 45 (see FIGS. 3A and 3B).

Figure 3A:
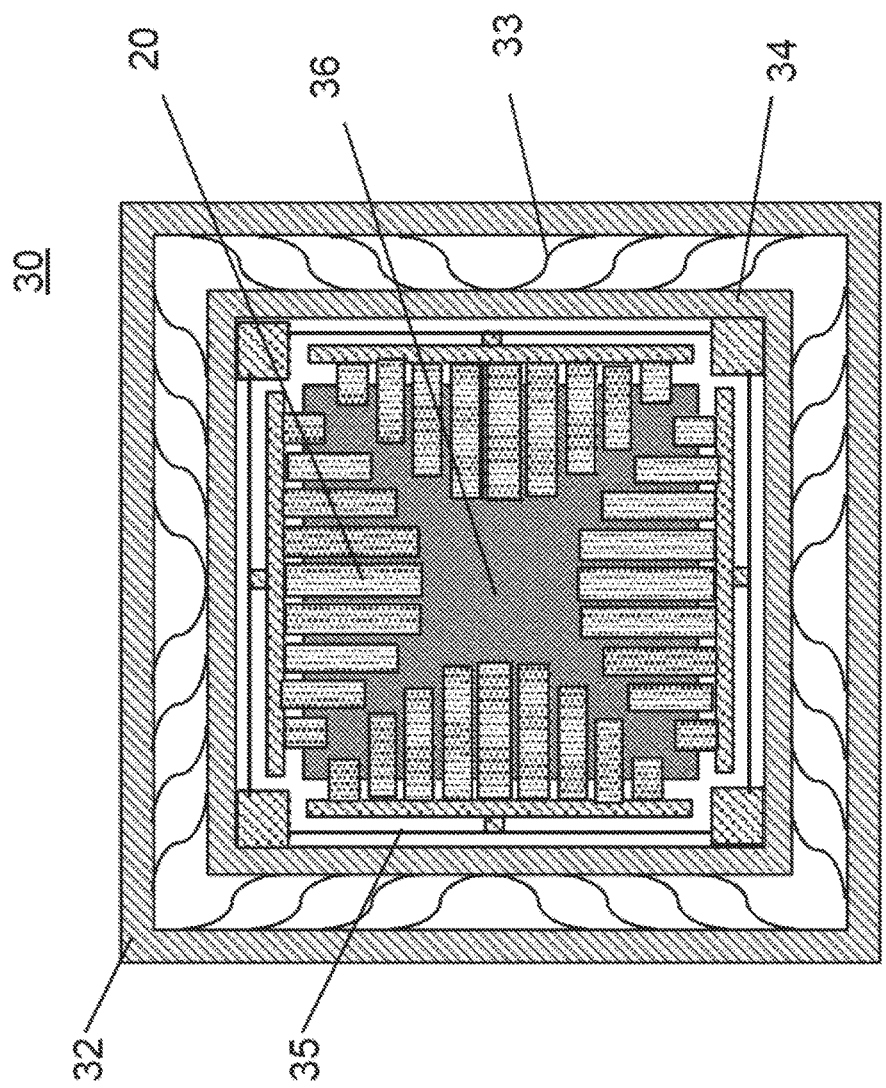
FIG. 3A illustrates a plan view of an actuator in accordance with example embodiments of the present disclosure.
Figure 3B:
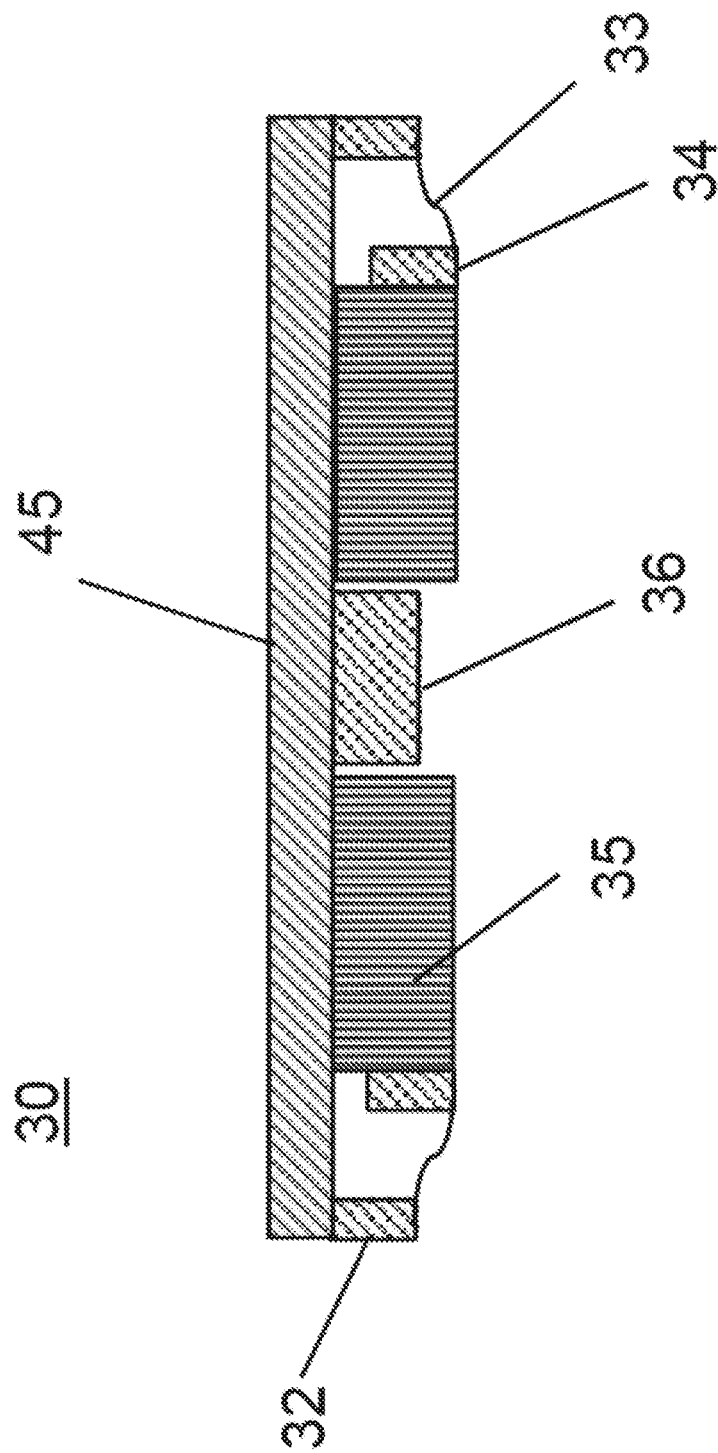
FIG. 3B illustrates a cross-sectional view of an actuator in accordance with example embodiments of the present disclosure.

FIG. 3A illustrates a plan view of actuator 30 in accordance with example embodiments of the present disclosure. FIG. 3B illustrates a cross-sectional view of actuator 30 in accordance with example embodiments of the present disclosure. As shown in FIG. 3A, actuator 30 includes outer frame 32 connected to inner frame 34 by one or more spring elements 33. Further, actuator 30 includes one or more comb drive actuators 20 that apply a controlled force (e.g., an electrostatic force developed from a voltage) between outer frame 32 and inner frame 34. Embodiments of actuator 30 are suitable for moving a platform (e.g., 45) having electrical connections, for actuator 30 enables precise, controlled, and variable forces to be applied between inner and outer frames 34 and 32 in multiple degrees of freedom (including linear and rotational, for example), and may be implemented using a highly compact footprint. Moreover, actuator 30 may utilize MEMS devices for reduction in power. Accordingly, actuator 30 provides multiple benefits over conventional solutions to optical image stabilization and autofocus applications constrained by size, power, cost, and performance parameters, such as in smartphone and other applications described herein.

As explained with reference to FIG. 2B, each comb drive actuator 20 includes one or more comb drives 10. Spring elements 33 may be electrically conductive and may be soft in all movement degrees of freedom. In various embodiments, spring elements 33 route electrical signals from electrical contact pads on outer frame 32 to electrical contact pads on the inner frame 34. In example implementations, spring elements 33 come out from inner frame 34 in one direction, two directions, three directions, or in all four directions.

In one embodiment, actuator 30 is made using MEMS processes such as, for example, photolithography and etching of silicon. In one embodiment, actuator 30 moves +/−150 micrometers in plane, and spring elements 33 are designed to tolerate this range of motion without touching one another (e.g., so that separate electrical signals can be routed on the various spring elements 33). For example, spring elements 33 may be S-shaped flexures ranging from about 1 to 5 micrometers in thickness, about 2 to 20 micrometers wide, and about 150 to 1000 micrometers by about 150 to 1000 micrometers in the plane.

In order for spring elements 33 to conduct electricity well with low resistance, spring elements 33 may contain, for example, heavily doped polysilicon, silicon, metal (e.g., aluminum), a combination thereof, or other conductive materials, alloys, and the like. For example, spring elements 33 may be made out of polysilicon and coated with a roughly 2000 Angstrom thick metal stack of Aluminum, Nickel, and Gold. In one embodiment, some spring elements 33 are designed differently from other spring elements 33 in order to control the motion between outer frame 32 and inner frame 34. For example, four to eight (or some other number) of spring elements 33 may have a device thickness between about 50 and 250 micrometers. Such a thickness may somewhat restrict out-of-plane movement of outer frame 32 with respect to inner frame 34.

In another embodiment, actuator 30 includes central anchor 36, and the one or more comb drives 20 apply a controlled force between inner frame 34 and central anchor 36. In this embodiment, first frame 22 is an connected to or an integral part of central anchor 36. One or more comb drive actuators 20 may be otherwise attached to central anchor 36, and central anchor 36 may be mechanically fixed with respect to outer frame 32. In one instance, second frame 24 is connected to inner frame 34 through flexures 35 that are relatively stiff in the respective comb-drive-actuator direction of motion and relatively soft in the orthogonal direction. This may allow for controlled motion of inner frame 34 with respect to outer frame 32, and thus, more precise positioning.

Figure 3C:
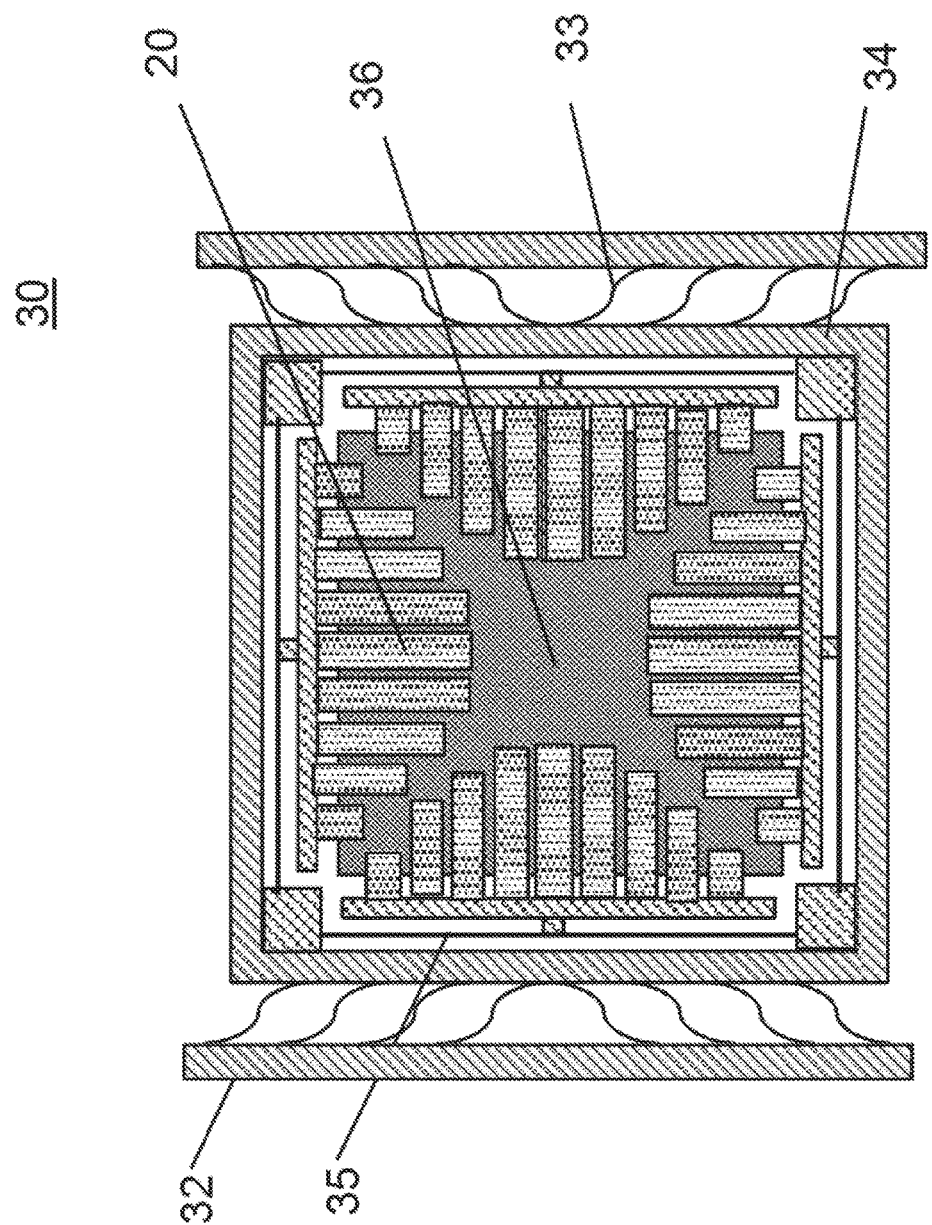
FIG. 3C illustrates a plan view of an actuator in accordance with example embodiments of the present disclosure.
Figure 3D:
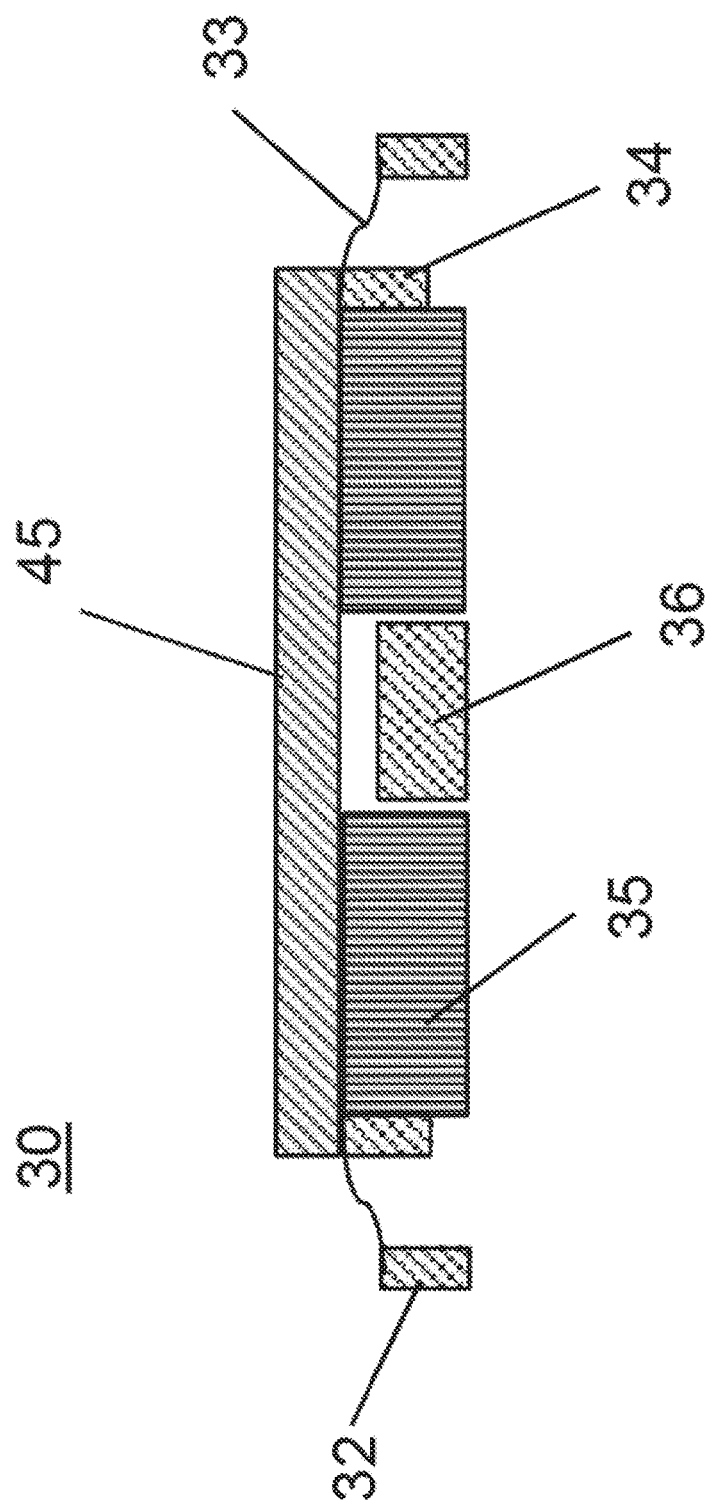
FIG. 3D illustrates a cross-sectional view of an actuator in accordance with example embodiments of the present disclosure.

Outer frame 32, in some implementations of actuator 30, is not continuous around the perimeter of actuator 30, but is broken into two, three, or more pieces. For example, FIGS. 3C and 3D illustrate plan and cross-sectional views of actuator 30 in accordance with example embodiments of the present disclosure in which outer frame 32 is divided into two sections, and spring elements 33 come out in only two directions. Similarly, inner frame 34 may be continuous or may be divided into sections, in various embodiments.

As shown in FIG. 3A, there may be four comb drives 10 total—two comb drives 10 actuate in one direction in the plane of actuator 30, and the other two comb drives 10 actuate in an orthogonal direction in the plane of actuator 30. Various other comb drive actuator 20 arrangements are possible. Such arrangements may include more or less comb drives 10, and may actuate in more or less degrees of freedom (e.g., in a triangular, pentagonal, hexagonal formation, or the like), as will be appreciated by one of skill in the art upon studying the present disclosure.

In one embodiment, platform 45 is attached to outer frame 32 and to central anchor 36. In this manner, platform 45 may fix outer frame 32 with respect to central anchor 36 (and/or vice versa). Inner frame 34 may then move with respect to both outer frame 32 and central anchor 36, and also with respect to platform 45. In one embodiment, platform 45 is a silicon platform. Platform 45, in various embodiments, is an optoelectronic device, or an image sensor, such as a charge-coupled-device (CCD) or a complementary-metal-oxide-semiconductor (CMOS) image sensor.

FIG. 3B illustrates that the size of actuator 30 may be substantially the same as the size as platform 45, and platform 45 may attach to outer frame 32 and central anchor 36, thus mechanically fixing central anchor 36 with respect to outer frame 32. In one example implementation, platform 45 is the OV8835 image sensor from Omni Vision with an optical format of 1/3.2". In this implementation, the size of both actuator 30 and platform 45 can be equal to about 6.41 mm by 5.94 mm. As shown in FIG. 3D, in one embodiment of actuator 30, platform 45 is smaller than actuator 30, and platform 45 attaches to inner frame 34. In this particular embodiment, outer frame 32 is fixed relative to inner frame 34, and inner frame 34 is moved by the various comb drive actuators 20.

Figure 4A:
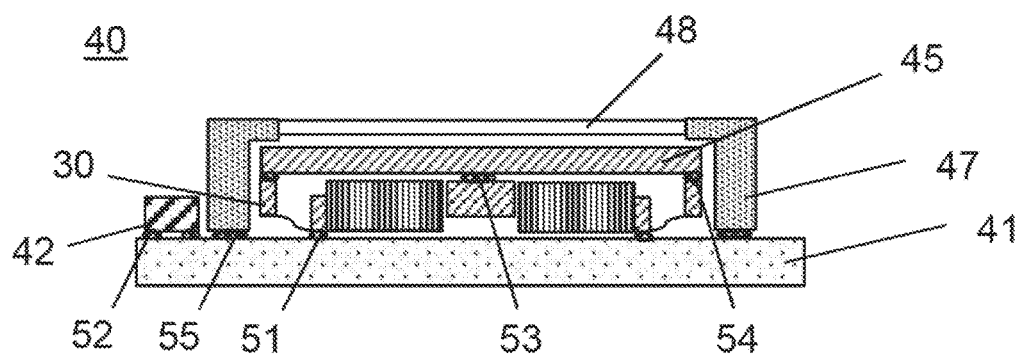
FIG. 4A illustrates a cross-sectional view of a packaged actuator in accordance with example embodiments of the present disclosure.

FIG. 4A illustrates a cross-sectional view of packaged actuator 40 in accordance with example embodiments of the present disclosure. Some embodiments of packaged actuator 40 may function in a fashion substantially similar to actuator 30. As such, packaged actuator 40 may be used to move and/or position a platform with a high degree of precision, with low power and cost, and using a compact footprint. Accordingly, packaged actuator 40 may be suitable in cameras for mobile electronics, medical devices, and the like, as described herein and as will be appreciated by one of skill in the art. Moreover, packaged actuator 40 offers multiple benefits over conventional solutions in this field, as described hereinabove. In one embodiment of packaged actuator 40, actuator 30 and other electrical components 42, such as, for example, capacitors, resistors, or integrated circuit chips, are attached to plain (or printed) circuit board (PCB) 41. By way of example, PCB 41 may be made out of multilayer ceramic or composite plastic material such as FR4, and may include copper traces used to route electrical signals through PCB 41.

FIG. 4A illustrates that, in one embodiment, platform 45 (which may, for example, be an image sensor) is attached to actuator 30, and housing 47 with window 48 is attached to PCB 41. In this manner, housing 47 encapsulates actuator 30 and platform 45. Housing 47 may be a black plastic housing, or may be made from various other materials/colors.

Figure 4B:
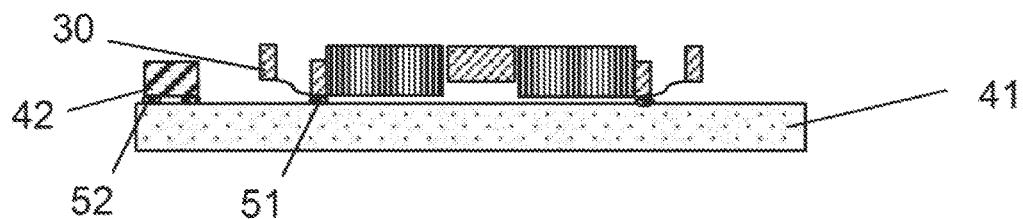
FIG. 4B illustrates a cross-sectional view of an assembly step of a packaged actuator in accordance with example embodiments of the present disclosure.

The first step in assembly of packaged actuator 40, according to one embodiment of the disclosure, is illustrated in FIG. 4B. Actuator 30 and other electrical components 42 may be attached to PCB 41 via electrical contacts 51 and 52. For example, such attachment may be accomplished using solder and a standard surface mount technology (SMT) process. As such, solder paste may be deposited on electrical contacts 51 and 52 before placing actuator 30 on PCB 41. Or, solder paste may be placed on top of actuator 30 after placing actuator 30 on PCB 41. In other instances, both of these methods may be used.

The entire assembly may then be placed in a reflow oven to melt and flow the solder paste and create reliable electrical contacts 51 and 52 between actuator 30 and PCB 41 and between other electrical components 42 and PCB 41, respectively. Epoxy may also be used to further strengthen the adhesion between actuator 30 and PCB 41 after reflow, as may be done for some of other electrical components 42. This is known in the SMT industry as an under fill process, and is commonly used along with flip chip processes.

Figure 4C:
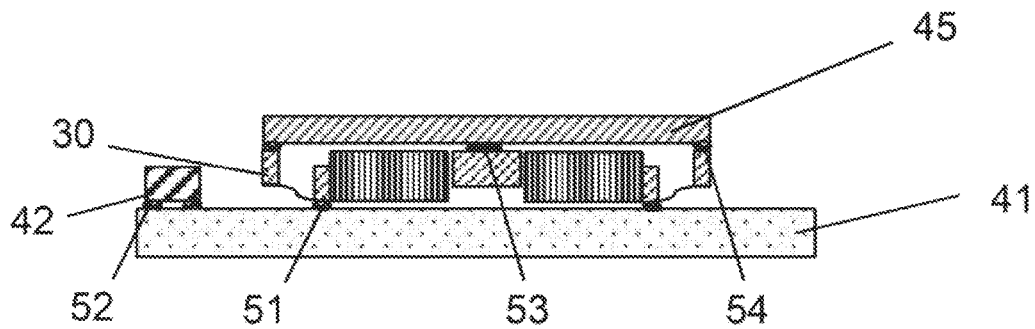
FIG. 4C illustrates a cross-sectional view of an assembly step of a packaged actuator in accordance with example embodiments of the present disclosure.

The second step in the assembly of packaged actuator 40, according to one example embodiment, is illustrated in FIG. 4C. As shown, platform 45 may be attached to actuator 30 using conductive material 54 to effect electrical contacts near the edges of platform 45. Additionally, second material 53 may be used to connect platform 45 to central anchor 36 near the center of platform 45.

In one embodiment, platform 45 is an image sensor capable of withstanding reflow temperature, and conductive material 54 is solder. In another embodiment, platform 45 is an image sensor having color filters and microlenses that do not withstand the high reflow temperature, such that a lower temperature process may be preferable. In this case, a material with nano-sized particles of metal may be used to take advantage of the lower melting temperature of metal formed in small size particles. A material, such as gold nano-ink may be ink jetted onto electrical contacts 51 and 52 on packaged actuator 40 and reflowed at a low temperature of around 100 degrees Celsius. Alternate lower temperature process materials include, for example, anisotropic conducting film (ACF) and conductive epoxy.

Second material 53, in one embodiment, is the same material as conductive material 54. This may reduce the number of materials dispensed onto actuator 30. In another embodiment, second material 53 is not electrically conductive. For example, second material 53 may be structural epoxy or adhesive that adheres to silicon and silicon dioxide.

The final example step in the assembly of packaged actuator 40 is to encapsulate actuator 30 and platform 45 with housing 47 that includes window 48. In one embodiment, window 48 has optical filter characteristics, such as, for example, to reject non-visible infra-red (IR) light that would be detected by an image sensor (e.g., platform 45) and cause color artifacts. In one embodiment, housing 47 is black so as to minimize transmission and reflection of stray light. In various embodiments, housing 47 may be made from various materials, such as plastic and the like, and may be various colors.

Figure 5:
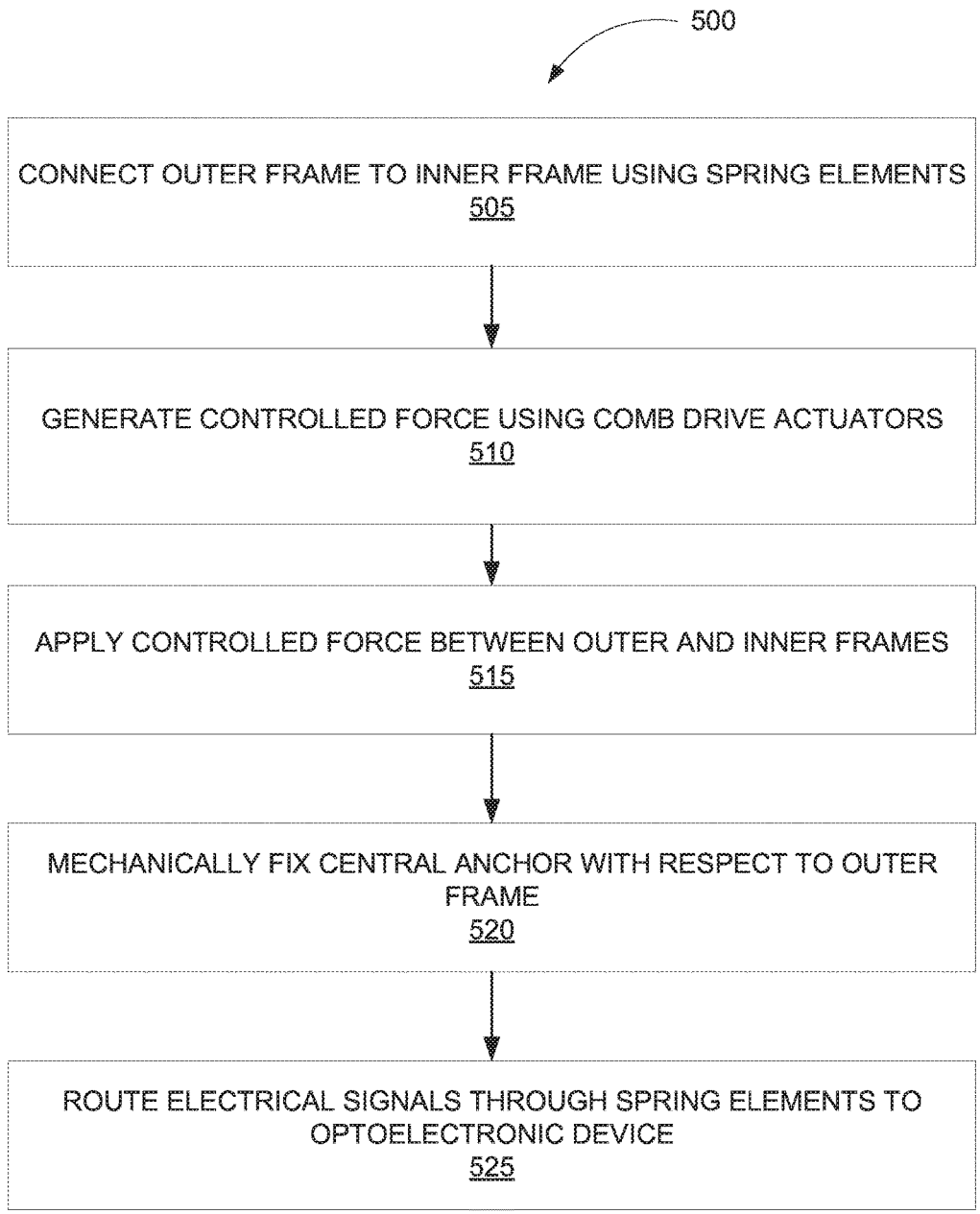
FIG. 5 illustrates an operational flow diagram of a method for moving a platform in accordance with example embodiments of the present disclosure.

FIG. 5 illustrates embodiments of method 500 for moving a platform 45 having electrical connections routed thereto. The operations of method 500 utilize electrostatic comb drives to achieve highly precise and efficient movement and positioning of a platform, for example, within a space-constrained environment such as a smartphone. This allows for optical image stabilization and/or autofocus capabilities that meet the cost, space, and energy demands of such environments.

As illustrated in FIG. 5, method 500 includes, at operation 505, connecting outer frame 32 to inner frame 34 using one or more spring elements 33 that are electrically conductive. At operation 510, method 500 includes generating a controlled force using one or more comb drive actuators 20, each of which includes one or more comb drives 10. Additionally, at operation 515, method 500 includes applying the controlled force between the outer frame 32 and inner frame 34.

An additional embodiment of method 500 includes, at operation 520, routing electrical signals through spring elements 33 to an optoelectronic device (e.g., platform 45) attached to central anchor 36. In this embodiment, the optoelectronic device mechanically fixes central anchor 36 with respect to outer frame 32. In one embodiment of method 500, the controlled force includes a first force component and a second force component, and the first and second force components are orthogonal to one another so as to enable two degrees of freedom.

In general, the various operations of method 500 described herein may be accomplished using or may pertain to components or features of the various systems and/or apparatus with their respective components and subcomponents, described herein. Moreover, in various embodiments, features and functions described herein with regard to FIGS. 1, 2A, 2B, 3A-D, and 4A-C may be implemented as operations of methods (e.g., method 500), in addition to being implemented as part of systems or apparatus. Upon studying this disclosure, one of skill in the art will recognize how to implement the disclosed method using the disclosed apparatus, and vice versa.

The presence of broadening words and phrases such as "one or more," "at least," "but not limited to" or other like phrases in some instances shall not be read to mean that the narrower case is intended or required in instances where such broadening phrases may be absent.

Additionally, the various embodiments set forth herein are described in terms of example block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

While various embodiments of the present disclosure have been described above, it should be understood that they have been presented by way of example only, and not of limitation. Likewise, the various diagrams may depict an example architectural or other configuration for the disclosure, which is done to aid in understanding the features and functionality that can be included in the disclosure. The disclosure is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present disclosure. Additionally, with regard to flow diagrams, operational descriptions and method claims, the order in which the steps are presented herein shall not mandate that various embodiments be implemented to perform the recited functionality in the same order unless the context dictates otherwise.

Although the disclosure is described above in terms of various example embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosure, whether or not such embodiments are described and whether or not such features are presented as being a part of a described embodiment. Thus, the breadth and scope of the present disclosure should not be limited by any of the above-described example embodiments, and it will be understood by those skilled in the art that various changes and modifications to the previous descriptions may be made within the scope of the claims.

What is claimed is:

1. A packaged actuator, comprising:
   a circuit board;
   a MEMS actuator that is substantially planar in a plane, wherein the MEMS actuator is configured to move in two linear degrees of freedom in the plane and in one rotational degree of freedom in the plane, wherein the MEMS actuator comprises one or more comb drive actuators that apply a controlled force to a central anchor, wherein the controlled force comprises a first force component and a second force component, wherein the first force component and the second force component are substantially orthogonal, wherein each of the comb drive actuators comprises one or more comb drives and an outer frame connected to an inner frame by one or more spring elements that are electrically conductive;
   an optoelectronic device mounted on the MEMS actuator; and
   a cover that encapsulates the MEMS actuator and the optoelectronic device, the cover comprising a window that is attached to the circuit board.

2. The packaged actuator of claim 1, wherein the central anchor is mechanically fixed with respect to the outer frame.

3. The packaged actuator of claim 1, wherein the optoelectronic device is attached to the central anchor.

4. The packaged actuator of claim 1, wherein the window is attached to the circuit board via a plastic frame.

5. The packaged actuator of claim 1, wherein the window comprises optical filter characteristics.

* * * * *